United States Patent
Delso (10) Patent No.: US 10,247,796 B2
(45) Date of Patent: Apr. 2, 2019

(54) SYSTEM AND METHOD FOR MARKING AN OBJECT DURING A MAGNETIC RESONANCE IMAGING SCAN

(71) Applicant: GENERAL ELECTRIC COMPANY, Schenectady, NY (US)

(72) Inventor: Gaspar Delso, Cambridge (GB)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 253 days.

(21) Appl. No.: 15/264,038

(22) Filed: Sep. 13, 2016

(65) Prior Publication Data
US 2018/0074143 A1    Mar. 15, 2018

(51) Int. Cl.
*G01R 33/48* (2006.01)
*G01R 33/3415* (2006.01)
*G01R 33/58* (2006.01)

(52) U.S. Cl.
CPC ....... *G01R 33/481* (2013.01); *G01R 33/3415* (2013.01); *G01R 33/58* (2013.01); *G01R 33/4816* (2013.01)

(58) Field of Classification Search
CPC ........ G01N 27/04; G01N 27/02; G01N 27/06; G01N 33/18; G01N 27/045
USPC ................. 324/693, 600, 649, 691
See application file for complete search history.

(56) References Cited

U.S. PATENT DOCUMENTS

| | | | | |
|---|---|---|---|---|
| 6,617,972 | B2* | 9/2003 | Takarada | G08B 21/0484 324/538 |
| 6,975,896 | B2 | 12/2005 | Ehnholm et al. | |
| 8,779,729 | B2* | 7/2014 | Shiraishi | G01R 31/3606 320/155 |
| 2012/0098518 | A1* | 4/2012 | Unagami | G01R 22/066 324/74 |
| 2013/0165767 | A1 | 6/2013 | Darrow et al. | |
| 2013/0278255 | A1* | 10/2013 | Khalighi | G01R 33/246 324/309 |
| 2014/0354283 | A1* | 12/2014 | Kwon | G01R 33/283 324/322 |
| 2016/0018487 | A1* | 1/2016 | Gulaka | G01R 33/283 324/309 |

FOREIGN PATENT DOCUMENTS

WO    2015169655 A1    11/2015

* cited by examiner

*Primary Examiner* — Giovanni Astacio-Oquendo
(74) *Attorney, Agent, or Firm* — Grogan, Tuccillo & Vanderleeden, LLP (57) ABSTRACT

A magnetic resonance imaging system is provided. The system includes a magnet assembly, a controller, and a marker. The magnet assembly defines a bore within which an object is disposed. The controller communicates with the magnet assembly. The marker is disposed on the object and emits a rapidly decaying magnetic resonance signal after being excited by a short-TE sequence scan executed by the controller via the magnet assembly.

19 Claims, 5 Drawing Sheets

SYSTEM AND METHOD FOR MARKING AN OBJECT DURING A MAGNETIC RESONANCE IMAGING SCAN

BACKGROUND

Technical Field

Embodiments of the invention relate generally to magnetic resonance imaging ("MRI" or "MR imaging"), and more specifically, to a system and method for marking an object during a magnetic resonance imaging scan.

Discussion of Art

MRI obtains digitized visual images representing the internal structure of objects having substantial populations of atomic nuclei that are susceptible to nuclear magnetic resonance ("NMR"). Many MRI systems use magnet assemblies that house superconductive magnets to impose a strong main magnetic field on the nuclei in the patient/object to be imaged within a target volume (hereinafter also referred to as the "imaging bore" and/or simply "bore"). The nuclei are excited by a radio frequency ("RF") signal typically transmitted via an RF coil at characteristic NMR (Larmor) frequencies. By spatially disturbing localized magnetic fields surrounding the object within the imaging bore, and analyzing the resulting RF responses (also referred to herein as "MR signals") from the nuclei as the excited protons relax back to their lower energy normal state, a map or image of these nuclei responses as a function of their spatial location is generated and displayed. An image of the nuclei responses provides a non-invasive view of an object's internal structure.

PET imaging involves the creation of tomographic images of positron emitting radionuclides in a subject of interest. A radionuclide-labeled agent is administered to a subject positioned within a detector ring. As the radionuclides decay, positively charged electrons known as "positrons" are emitted therefrom. As these positrons travel through the tissues of the subject, they lose kinetic energy and ultimately collide with an electron, resulting in mutual annihilation. The positron annihilation results in a pair of oppositely directed gamma rays being emitted at approximately 511 keV, which are subsequently detected by scintillators in the detector ring. When struck by a gamma ray, each scintillator illuminates, activating a photovoltaic component, such as a photodiode.

The signals from the photovoltaics are processed as incidences of gamma rays. When two gamma rays strike oppositely positioned scintillators at approximately the same time, a coincidence is registered. Data sorting units process the coincidences to determine true coincidence events and to sort out data representing dead times and single gamma ray detections. The coincidence events are binned and integrated to form frames of PET data which may be reconstructed into images depicting the distribution of the radionuclide-labeled agent and/or metabolites thereof in the subject.

In many MRI systems, the best excitation field homogeneity is obtained by using a whole-body volume RF coil for transmission. The whole-body transmit coil is often the largest RF coil in such MRI systems. A large RF coil, however, produces lower signal-to-noise ratio ("SNR") if it is also used to receive the RF responses, mainly because such RF coils are often at great distances from the signal-generating tissues being imaged. Because a high SNR is usually desirable in MRI, "surface coils" are commonly employed for reception of the RF responses to enhance the SNR from a particular volume-of-interest. Generally, surface coils are relatively small and are constructed to receive the RF responses from a localized portion of the patient, e.g., different surface coils may be employed for imaging the head, neck, legs, arms, and/or various internal organs.

In a combined PET-MRI system, however, surface coils can potentially distort, i.e., attenuate, the emitted gamma rays prior to detection by the scintillators in the detector ring. Accordingly, many PET-MRI systems rely on attenuation correction algorithms to compensate for the distortion caused by surface coils. Such algorithms, however, often require that the shape, location, and material density of the surface coils be known with a high level of precision. As a result, many PET-MRI systems are limited to using so called non-floating "rigid" surface coils, which are typically non-flexible and mounted/fixed to a known stationary location.

Many MRI systems, however, utilize floating surface coils, which generally produce greater SNR than rigid surface coils as they are typically placed on a patient's body and are thus closer to the imaged tissue. Indeed, floating surface coils are typically supported by a patient's body, and therefore often move in relation to a patient's movement. As a result, the location of such coils is neither fixed nor known with great precision. Many floating surface coils are flexible, i.e., non-rigid, as well such that the coil shape may also not be known with great precision.

While some PET-MRI systems mark floating surface coils with markers that are visible/detectable via a standard MRI sequence scan, such markers often result in artifacts, e.g., phase wrap, that often cause false-positive medical diagnoses.

What is needed, therefore, is an improved system and method for marking an object during a magnetic resonance imaging scan.

BRIEF DESCRIPTION

In an embodiment, a magnetic resonance imaging system is provided. The system includes a magnet assembly, a controller, and a marker. The magnet assembly defines a bore within which an object is disposed. The controller communicates with the magnet assembly. The marker is disposed on the object and emits a rapidly decaying magnetic resonance signal after being excited by a short-TE sequence scan executed by the controller via the magnet assembly.

In another embodiment, a marker for a magnetic resonance imaging system is provided. The marker includes a body configured to be disposed on an object within a bore defined by a magnet assembly of the magnetic resonance imaging system. The body emits a rapidly decaying magnetic resonance signal after being excited by a short-TE sequence scan executed by the magnetic resonance imaging system.

In yet another embodiment, a method for marking an object during a magnetic resonance imaging scan is provided. The method includes: placing a subject within a bore defined by a magnet assembly of a magnetic resonance imaging system, the magnet assembly in communication with a controller of the magnetic resonance imaging system; placing the object within the bore; marking the object with a marker; executing a short-TE sequence scan of the subject and the object via the controller and the magnet assembly; and sensing a rapidly decaying magnetic resonance signal emitted by the marker after being excited by the short-TE sequence scan so as to detect the marker.

DRAWINGS

The present invention will be better understood from reading the following description of non-limiting embodiments, with reference to the attached drawings, wherein below.

DETAILED DESCRIPTION

Reference will be made below in detail to exemplary embodiments of the invention, examples of which are illustrated in the accompanying drawings. Wherever possible, the same reference characters used throughout the drawings refer to the same or like parts, without duplicative description.

As used herein, the terms "substantially," "generally," and "about" indicate conditions within reasonably achievable manufacturing and assembly tolerances, relative to ideal desired conditions suitable for achieving the functional purpose of a component or assembly. The term "real-time," as used herein, means a level of processing responsiveness that a user senses as sufficiently immediate or that enables the processor to keep up with an external process. As also used herein, the term "spatial location" means the location and/or orientation of an object in two-dimensional and/or three-dimensional space. As used herein, "electrically coupled", "electrically connected", "electrical communication", and "communication" mean that the referenced elements are directly or indirectly connected such that an electrical current, or other communication medium, may flow from one to the other. The connection may include a direct conductive connection, i.e., without an intervening capacitive, inductive or active element, an inductive connection, a capacitive connection, and/or any other suitable electrical connection. Intervening components may be present. As further used herein, the term "attenuation correction" means a process and/or algorithm that corrects/accounts for the distortion in PET imaging resulting from the loss of detection events due to absorption and/or scattering of gamma rays produced from the decay of a radionuclide-labeled agent that has been injected into an object to be imaged.

Further, as used herein, the terms "traditional MRI sequence," and "traditional MRI scan," or any variation thereof, refer to MRI sequences scans, executed and obtained in accordance with standard echo times ("TE"). Accordingly, the term "traditional MR signals," as used herein, refers to the MR signals obtained/detected by traditional MRI scans. As also used herein, the term "rapidly decaying magnetic resonance signal" ("RDMRS"), refers to a magnetic resonance signal, emitted by an object after being stimulated by radiofrequency excitation, that dissipates/decays during periods that are typically too short to be detected by traditional MRI sequence scans, i.e., the RDMRSs typically decay prior to the TE of traditional MRI scans. Accordingly, as used herein, the terms "short-TE sequence scan," "short-TE scan," "zero echo time sequence scan," "ZTE scan," and/or any variation thereof, refer to a MRI sequence scan which utilizes a radial center-out k-space sampling which starts immediately after, or shortly following, a radio frequency excitation of a subject. Embodiments may utilize two or three-dimensional sampling. In certain embodiments, the ZTE sequence scan may last for 20 seconds with the following parameter settings: FOV 28 cm; ST 2.5 mm; slice count 100; FA 1°; frequency 112; NEX 2; BW 62.5 kHz. As is to be understood, RDMRSs are typically undetectable/invisible via traditional MRI sequence scans, but are detectable via short-TE/ZTE sequence scans.

Additionally, while the embodiments disclosed herein are described with respect to a hybrid PET-MRI system, it is to be understood that embodiments of the present invention may be applicable to other systems, e.g., SPECT/MR, and/or any other imaging systems that incorporate MRI technology, to include standalone MRIs. Further, as will be appreciated, embodiments of the present invention related imaging systems may be used to analyze animal tissue, and other materials generally, and are not limited to human tissue.

Figure 1:
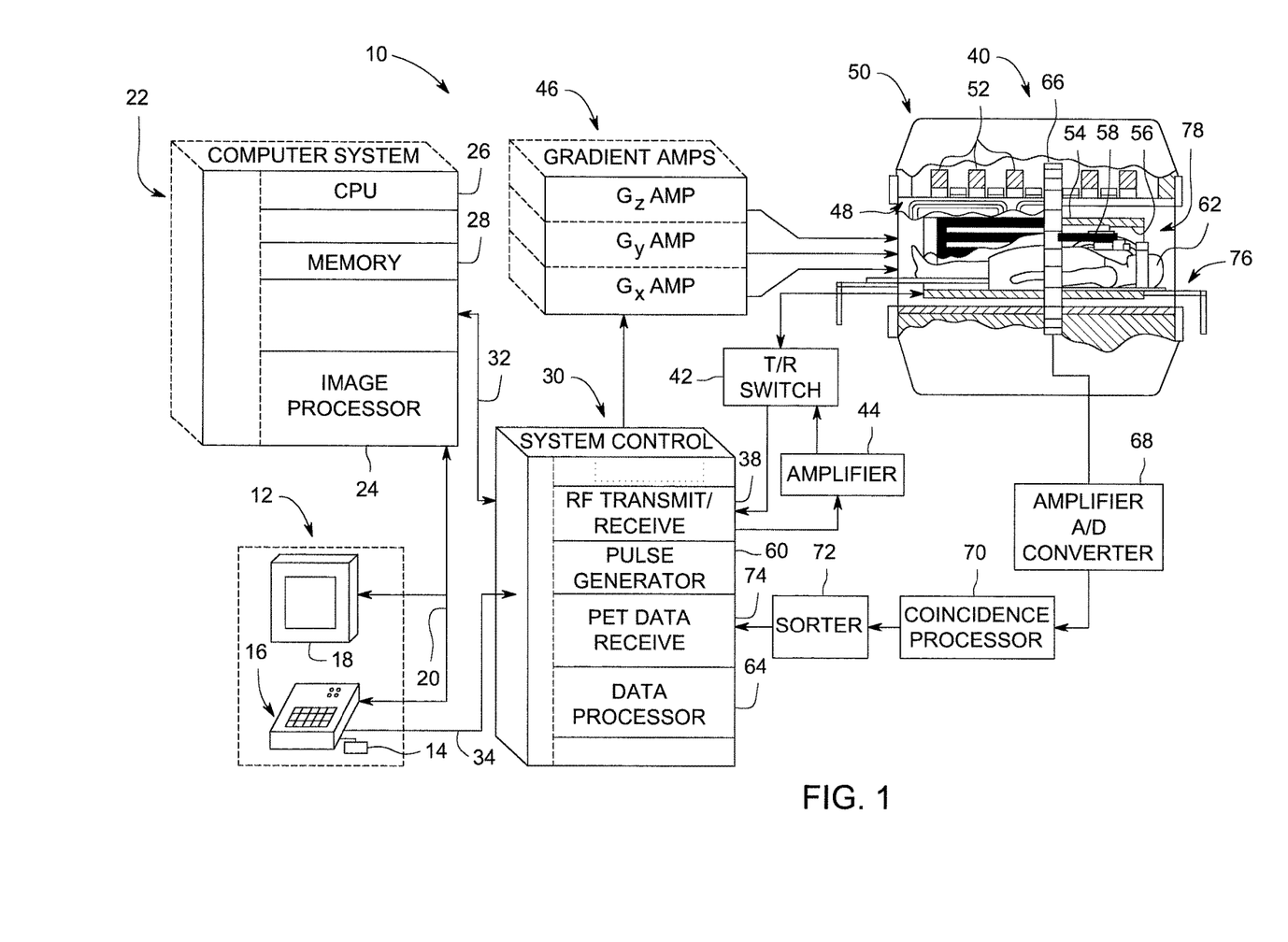
FIG. 1 is a schematic block diagram of a PET-MRI system that includes a magnet assembly in accordance with an embodiment of the present invention.

Referring now to FIG. 1, the major components of a hybrid PET-MRI system 10 that incorporates embodiments of the present invention are shown. As will be appreciated and described below, the PET-MRI system 10 combines both a PET sub-system and an MRI sub-system. The operation of the system 10 may be controlled from an operator console 12, which includes a keyboard or other input device 14, a control panel 16, and a display screen 18. The console 12 communicates through a link 20 with a separate computer system 22 that enables an operator to control the production and display of images on the display screen 18. The computer system 22 includes a number of modules, such as an image processor module 24, a CPU module 26, and a memory module 28. The computer system 22 may also be connected to permanent or back-up memory storage, a network, or may communicate with a separate system controller 30 through link 32. The input device 14 can include a mouse, keyboard, track ball, touch activated screen, light wand, or any similar or equivalent input device, and may be used for interactive geometry prescription.

The system controller 30 includes a set of modules in communication with one another and connected to the operator console 12 through link 34. It is through link 32 that the system controller 30 receives commands to indicate the scan sequence or sequences that are to be performed. For MRI data acquisition, an RF transmit/receive module 38 commands the scanner 40 to carry out the desired scan sequence, by sending instructions, commands, and/or requests describing the timing, strength and shape of the RF pulses and pulse sequences to be produced, to correspond to the timing and length of the data acquisition window. In this regard, a transmit/receive switch 42 controls the flow of data via amplifier 44 to scanner 40 from RF transmit module 38, and from scanner 40 to RF receive module 38. The system controller 30 also connects to a gradient amplifier sub-system 46, having amplifiers $G_x$, $G_y$, and $G_z$, to indicate the timing and shape of the gradient pulses that are produced during the scan.

The gradient waveform instructions produced by system controller 30 are sent to the gradient amplifier sub-system 46 which may be external of the scanner 40 or of the system controller 30, or may be integrated therein. Each gradient amplifier, $G_x$, $G_y$, and $G_z$, excites a corresponding physical gradient coil in a gradient coil assembly generally designated 48 to produce the magnetic field gradients used for spatially encoding acquired signals. The gradient coil assembly 48 forms part of a magnet assembly 50 which includes a polarizing magnet 52 and an RF coil assembly 54. Alternatively, the gradient coils of gradient coil assembly 48 may be independent of the magnet assembly 50. In embodiments, the RF coil assembly 54 may include a whole-body RF transmit coil 56. As will be appreciated, coil 56 of the RF coil assembly 54 may be configured for transmitting RF pulses while a separate surface coil 58 is configured to receive RF signals. A pulse generator 60 may be integrated into the system controller 30 as shown, or may be integrated into the MRI scanner 40, to produce pulse sequences or pulse sequence signals for the gradient amplifiers 46 and/or the RF coil assembly 54. In addition, pulse generator 60 may generate PET data blanking signals synchronously with the production of the pulse sequences. These blanking signals may be generated on separate logic lines for subsequent data processing. The MR signals resulting from the excitation pulses, emitted by the excited nuclei in a patient/subject/imaged object 62, may be sensed by surface coil 58 and then transmitted to the RF transmit/receive module 38 via T/R switch 42. The MR signals are demodulated, filtered, and digitized in a data processing controller/processer 64 of the system controller 30.

An MRI scan is complete when one or more sets of raw k-space data has been acquired in the data processing controller 64. This raw k-space data is reconstructed in data processing controller 64, which operates to transform the data (through Fourier or other techniques) into image data. This image data is conveyed through link 32 to the computer system 22 where it is stored in the memory module 28. Alternatively, in some embodiments, computer system 22 may assume the image data reconstruction and other functions of data processing controller 64. In response to commands received from the operator console 12, the image data stored in memory module 28 may be archived in long term storage or may be further processed by the image processor 24 or CPU 26, conveyed to the operator console 12, and presented on the display 18. As is to be appreciated, the controller may be configured to perform a ZTE scan via the MRI scanner 40, to include the magnet assembly 50.

In combined PET-MRI systems, PET data may be acquired simultaneously with the MRI data acquisition described above. Thus, the scanner 40 also includes a positron emission detector array or ring 66 configured to detect gamma rays from positron annihilations emitted from the imaged subject 62. The detector ring 66 preferably includes a plurality of scintillators and photovoltaics arranged about a gantry. As will be appreciated, however, in embodiments, the detector array 66 may be of any suitable construction for acquiring PET data. In addition, the scintillator, photovoltaics, and other electronics of the detector ring 66 need not be shielded from the magnetic fields and/or RF fields applied by the polarizing magnet 52 and whole-body RF transmit coil 56. It is contemplated, however, that embodiments of the present invention may include such shielding as known in the art, or may be combined with various other shielding techniques.

Gamma ray incidences detected by the detector ring 66 are transformed, by the photovoltaics of the detector ring 66, into electrical signals which are conditioned by a series of front end electronics 68. These conditioning circuits 68 may include various amplifiers, filters, and analog-to-digital converters. The digital signals outputted from the front-end electronics 68 are then processed by a coincidence processor 70 to match gamma ray detections as potential coincidence events. When two gamma rays strike detectors approximately opposite one another, it is possible, absent the interactions of random noise and signal gamma ray detections, that a positron annihilation took place somewhere along the line between the detectors. Thus, the coincidences determined by coincidence processor 70 are sorted into true coincidence events and ultimately integrated by data sorter 72. The coincidence event data, or PET data, from sorter 72 is received by the system controller 30 at a PET data receive port 74 and stored in memory 28 for subsequent processing by the data processing controller 64. PET images may then be reconstructed by image processor 24 and combined with MR images to produce hybrid structural and metabolic or functional images. Conditioning circuits 68, coincidence processor 70, and sorter 72 may each be external of the scanner 40 or the system controller 30, or may be integrated therein.

Also included in PET-MR imaging system 10 is a patient support assembly/cradle 76 configured to support the patient/subject 62 within a bore 78 of the magnet assembly 50 during data acquisition. The patient cradle 76 enables movement of the patient 62 into various positions with respect to the magnet assembly 50, including a loading position outside the bore 78, and at least one imaging position, where at least a portion of the patient/subject 62 is positioned within an imaging volume (i.e., within the bore 78) when at the imaging position.

Figure 2:
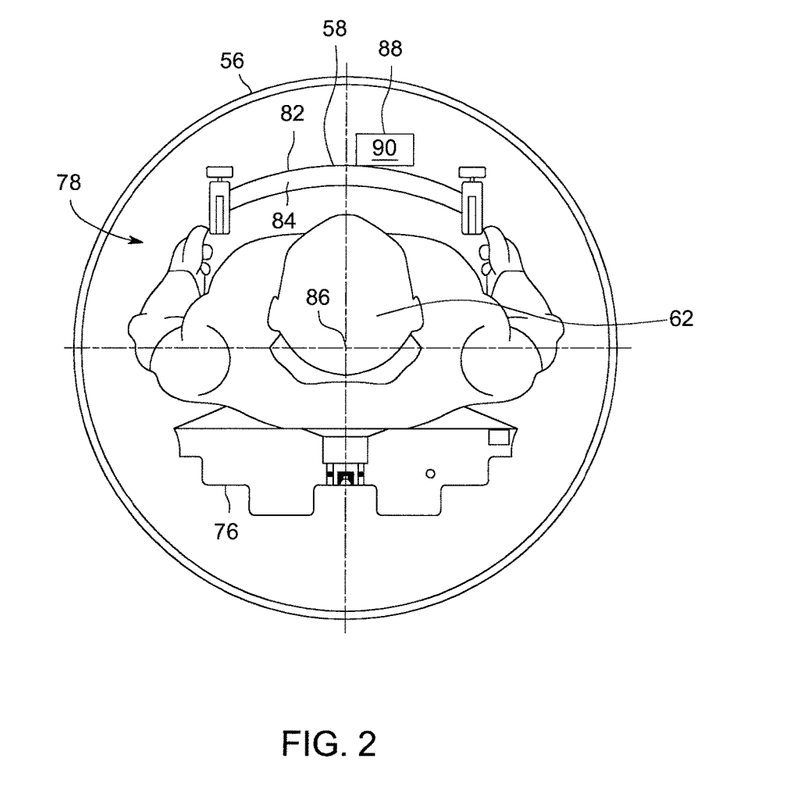
FIG. 2 is a perspective view of the magnet assembly of FIG. 1 in accordance with an embodiment of the present invention.
Figure 3:
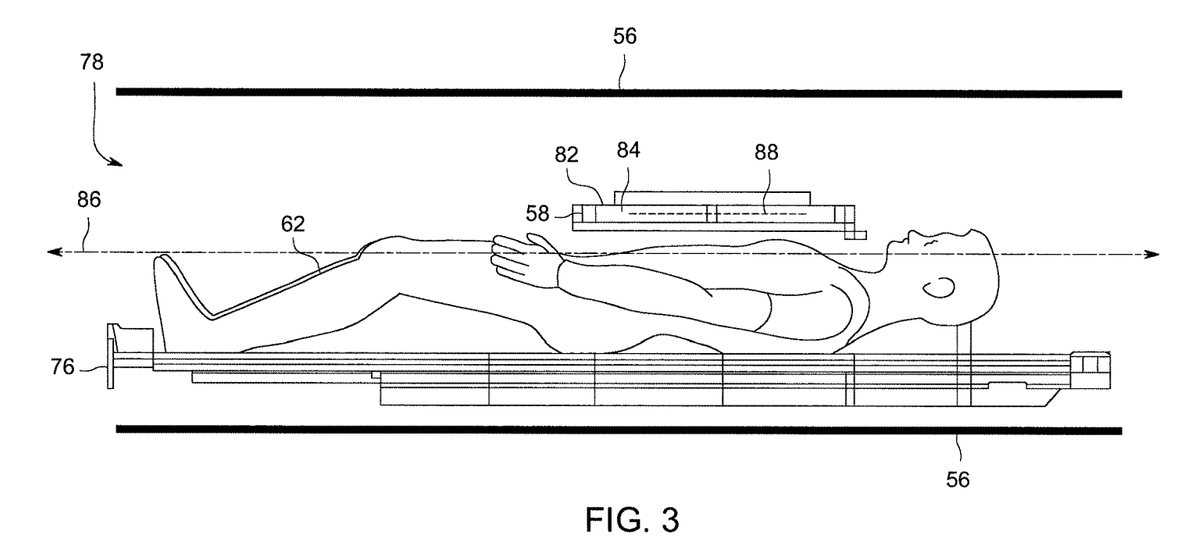
FIG. 3 is another perspective view of the magnet assembly of FIG. 1 in accordance with an embodiment of the present invention.

As illustrated in FIGS. 2 and 3, in embodiments, the surface coil 58 has an exterior surface 82 that defines an interior volume 84, and is configured to rest and/or be supported by the patient 62, i.e., in embodiments, the surface coil 58 may be a floating surface coil. In such embodiments, the surface coil 58 is not fixed to a known stationary location. Accordingly, the surface coil 58 may move in response to movements by the patient 62 in relation to a center axis 86 of the bore 78. While the surface coil 58 depicted in FIGS. 2 and 3 is configured to cover the patient's 62 torso, it is to be appreciated that the surface coil 58 may be configured to cover other areas of the patient 62, e.g., the head, arms, lower torsos, legs, etc. Further, the surface coil 58 may be either rigid, i.e., non-flexible, and/or flexible, e.g., adjustably and/or naturally conforming to the shape of the patient 62.

As further shown in FIGS. 2 and 3, the PET-MRI system 10 also includes at least one marker 88 configured to mark an object 58 disposed within the bore 78 during a MRI scan. While the embodiments herein depict the marked object 58 as a surface coil, the term "object," as used herein, refers to any type of device, e.g., braces, stents, catheters, etc., that can be disposed on/within the subject 62, or otherwise within the bore 78, the position of which within the bore 78 needs to be determined during a system 10 scan. Specifically, the marker 88 includes a body 90 that emits RDMRSs, sensed/detected/visible to a ZTE scan sequence executed by the controller 30 via the magnet assembly 50, while emitting little or no traditional MR signals.

As will be appreciated, in embodiments, the body 90 of the marker 88 may be configured to be disposed on the object/coil 58 (FIG. 2), and may be made from, or otherwise include: rubber; plastics; and/or any other suitable material that emits RDMRSs while emitting little or no traditional MR signals. The marker 88 may also be disposed within the interior volume 84 of the object/coil 58 (as indicated by the dashed line 88 in FIG. 3), and/or otherwise integrated into the object/coil 58, and may also be implemented in a variety of physical forms. For example, in embodiments, the body 90 may be rectangular, circular, thick, thin, and/or any other appropriate shape for a marker. In some embodiments, the body 90 may be in the form of a piece of adhesive tape that is then attached to the exterior surface 82 of the object/coil 58, and/or other appropriate location on and/or within the object/coil 58. Additionally, it is also to be understood that some embodiments need not require a separate marker 88 that has been disposed on, in, and/or inserted into an object 58. For example, in such embodiments, materials already forming part of one or more objects 58 and/or the subject 62, e.g., hardware components, and bone and lung tissues, that emit RDMRSs may be utilized as markers 88 which are integrated into the object/coil 58 and/or subject 62.

As stated above, in embodiments, the marker 88 is detectable/imaginable via a ZTE scan facilitated/performed/executed by the controller 30 via the magnet assembly 50 included in the MRI scanner 40. Thus, the marker 88 may be used to mark the object/coil 58 such that the spatial location/position of the object/coil 58 within the bore 78 can be determined by detecting the marker 88.

Accordingly, in embodiments, the controller 30 may utilize a closest point ("ICP") algorithm to register the markers 88 identified from the obtained MR data. As will be appreciated, such algorithms may provide for a rigid transformation and/or a measure of accuracy with respect to the location/position of the object/coil 58 within the bore 78. In embodiments, the registration algorithm may be a greedy algorithm which determines an optimal subset of N markers 88.

Figure 4:
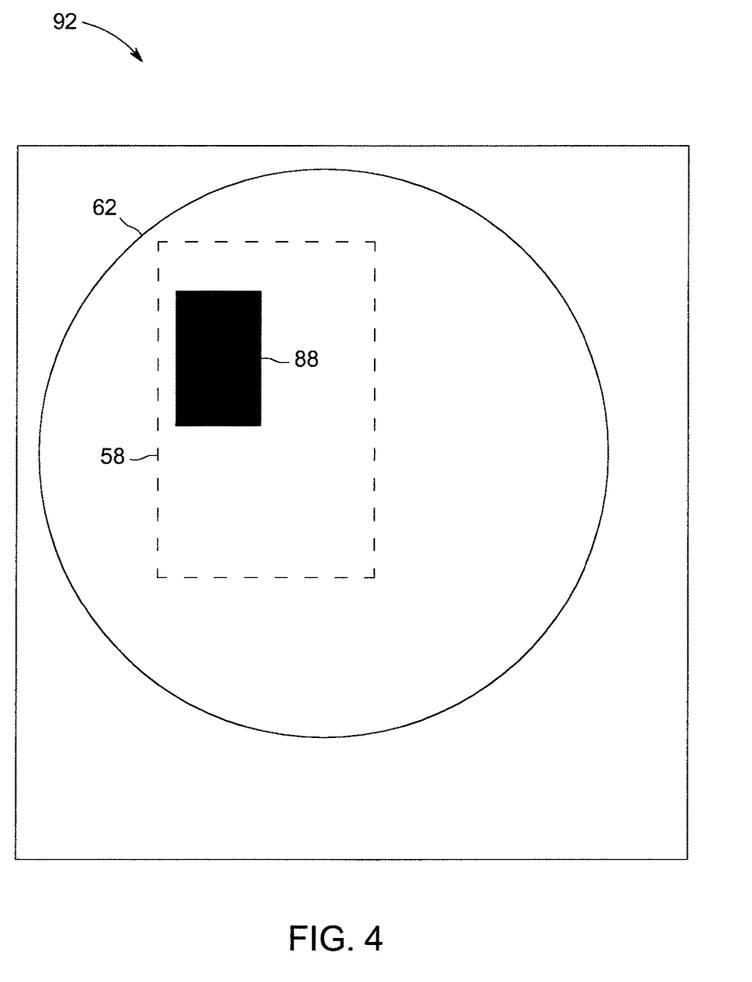
FIG. 4 is an image of a subject generated by the PET-MRI system of FIG. 1.

Turning now to FIG. 4, in embodiments, the marker 88 may serve as a landmark/fiducial marker within an image 92 generated by the system 10. In other words, the controller 30 may generate an image 92 that includes/depicts the subject 62 and the marker 88. For example, in embodiments, the controller 30 may execute both a ZTE scan, which images the marker 88, and a traditional MRI scanning sequence, which images the subject 62, and then merge the MR data and/or corresponding image data from both the ZTE scan and the traditional MRI scanning sequence to generate a composite image 92. Thus, the marker 88 can serve as a fiducial marker from which the spatial location/position/size of other objects within the same image may be determined.

Figure 5:
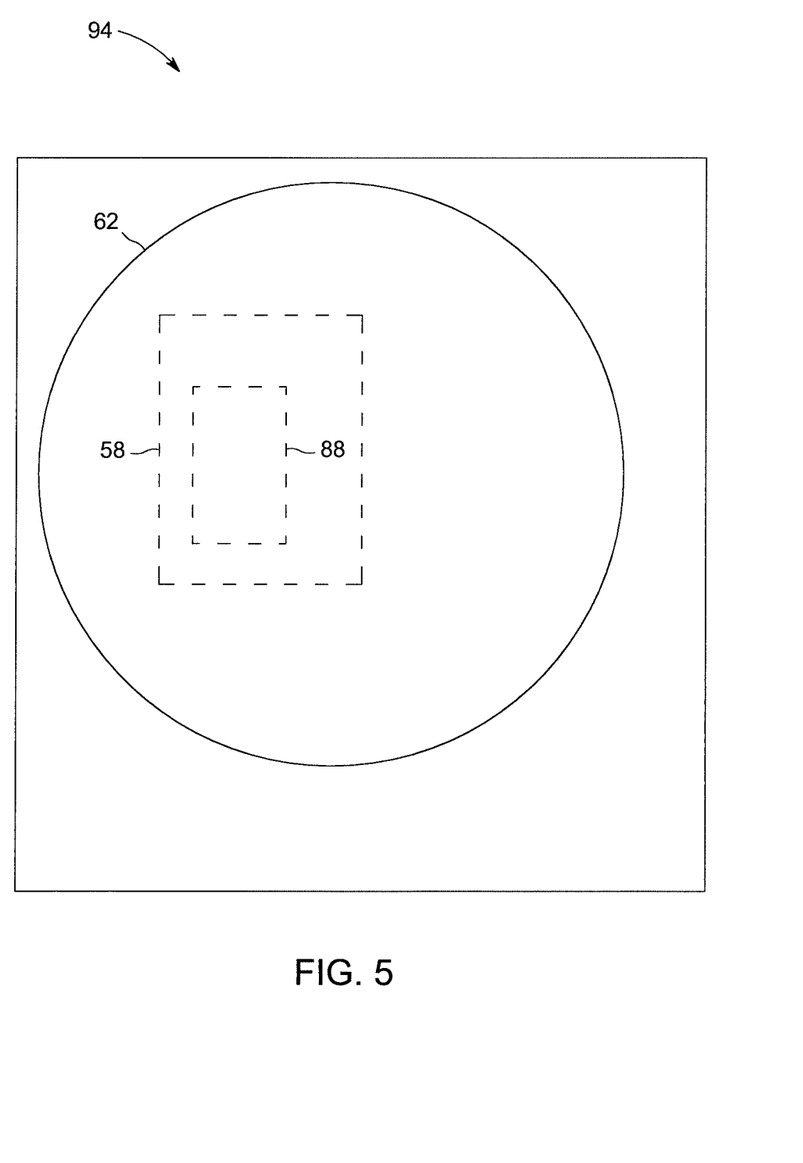
FIG. 5 is another image of a subject generated by the PET-MRI system of FIG. 1.

As shown in FIG. 5, in other embodiments, the controller 30 may generate an image 94 that includes the subject 62 but does not include the marker (as indicated by the dashed rectangle 88). In other words, the marker 88 may be used to determine the position of the object/coil 58, which may also not be visible in the image 92/94 (as indicated by the dashed rectangles 58 in FIGS. 4 and 5). For example, in embodiments, the controller 30 may execute both a ZTE scan, which images the marker 88, and a traditional scanning sequence, which images the subject 62. The controller 30 may then examine/analysis the MR data, i.e., k-space, obtained during the ZTE scan to determine a spatial location/position of the marker 88. Once the controller 30 has identified/determined the position of the marker 88, the controller 30 may then determine a spatial location/position of the object/coil 58 even though the object/coil 58 may not be clearly visible, or not visible at all, in either the ZTE k-space and/or the k-space obtained from the traditional MR scanning sequence.

Accordingly, in embodiments wherein the system 10 is a PET-MRI, the controller 30 may utilize the determined position of the object 58 to correct the acquired PET emissions for attenuation, i.e., in embodiments, the marker 88 provides for the controller 30 to correct the acquired PET emissions for attenuation caused by a floating surface coil 58, or other marked object, without causing phase wraps, and/or other distortions, to the actual MR image viewed/used by a physician.

As is also to be appreciated, in yet still other embodiments, the determined position/location of the marker 88 and/or object 58 may facilitate radiotherapy planning.

Finally, it is also to be understood that the system 10 may include the necessary electronics, software, memory, storage, databases, firmware, logic/state machines, microprocessors, communication links, displays or other visual or audio user interfaces, printing devices, and any other input/output interfaces to perform the functions described herein and/or to achieve the results described herein. For example, as previously mentioned, the system 10 may include at least one processor (e.g., 24, 26, and 64 in FIG. 1), and system memory/data storage structures (e.g., 28 in FIG. 1), which may include random access memory (RAM) and read-only memory (ROM). The at least one processor of the system 10 may include one or more conventional microprocessors and one or more supplementary co-processors such as math co-processors or the like. The data storage structures discussed herein may include an appropriate combination of magnetic, optical and/or semiconductor memory, and may include, for example, RAM, ROM, flash drive, an optical disc such as a compact disc and/or a hard disk or drive.

Additionally, a software application that provides for the calculation/detection/determination of the marker 88 and/or the surface coil 58, as well as for the attenuation correction of the received PET emissions, may be read into a main memory of the at least one processor from a computer-readable medium. The term "computer-readable medium", as used herein, refers to any medium that provides or participates in providing instructions to the at least one processor of the system 10 (or any other processor of a device described herein) for execution. Such a medium may take many forms, including but not limited to, non-volatile media and volatile media. Non-volatile media include, for example, optical, magnetic, or opto-magnetic disks, such as memory. Volatile media include dynamic random access memory (DRAM), which typically constitutes the main memory. Common forms of computer-readable media include, for example, a floppy disk, a flexible disk, hard disk, magnetic tape, any other magnetic medium, a CD-ROM, DVD, any other optical medium, a RAM, a PROM, an EPROM or EEPROM (electronically erasable programmable read-only memory), a FLASH-EEPROM, any other memory chip or cartridge, or any other medium from which a computer can read.

While in embodiments, the execution of sequences of instructions in the software application causes at least one processor to perform the methods/processes described herein, hard-wired circuitry may be used in place of, or in combination with, software instructions for implementation of the methods/processes of the present invention. Therefore, embodiments of the present invention are not limited to any specific combination of hardware and/or software.

It is further to be understood that the above description is intended to be illustrative, and not restrictive. For example, the above-described embodiments (and/or aspects thereof) may be used in combination with each other. Additionally, many modifications may be made to adapt a particular situation or material to the teachings of the invention without departing from its scope.

For example, in an embodiment, a magnetic resonance imaging system is provided. The system includes a magnet assembly, a controller, and a marker. The magnet assembly defines a bore within which an object is disposed. The controller communicates with the magnet assembly. The marker is disposed on the object and emits a rapidly decaying magnetic resonance signal after being excited by a short-TE scan sequence executed by the controller via the magnet assembly. In certain embodiments, the controller generates an image that includes the marker. In certain embodiments, the controller determines a position of the object by detecting the rapidly decaying magnetic resonance signal via the magnet assembly. In certain embodiments, the system further includes a positron emission tomography sub-system that acquires PET emissions from a subject within the bore, and the controller corrects the acquired PET emissions for attenuation based at least in part on the determined position of the object. In certain embodiments, the controller generates an image that includes a subject within the bore but does not include the marker. In certain embodiments, the object floats within the bore. In certain embodiments, the object is a surface coil. In certain embodiments, the marker is in the form of adhesive tape. In certain embodiments, the marker is integrated into the object.

Other embodiments provide for a marker for a magnetic resonance imaging system. The marker includes a body configured to be disposed on an object within a bore defined by a magnet assembly of the magnetic resonance imaging system. The body emits a rapidly decaying magnetic resonance signal after being excited by a short-TE sequence scan executed by the magnetic resonance imaging system. In certain embodiments, the object is configured to be inserted into a subject to be imaged by the magnetic resonance imaging system. In certain embodiments, the body is in the form of adhesive tape. In certain embodiments, the body is integrated into the object.

Yet still other embodiments provide for a method for marking an object during a magnetic resonance imaging scan. The method includes: placing a subject within a bore defined by a magnet assembly of a magnetic resonance imaging system, the magnet assembly in communication with a controller of the magnetic resonance imaging system; placing the object within the bore; marking the object with a marker; executing a short-TE sequence scan of the subject and the object via the controller and the magnet assembly; and sensing a rapidly decaying magnetic resonance signal emitted by the marker after being excited by the short-TE sequence scan so as to detect the marker. In certain embodiments, the method further incudes generating an image that includes the marker. In certain embodiments, the method further includes determining a position of the object based at least in part on the detected rapidly decaying magnetic resonance signal. In certain embodiments, the magnetic resonance imaging system includes a positron emission tomography sub-system. In such embodiments, the method further includes: acquiring PET emissions from the subject; and correcting the acquired PET emissions for attenuation based at least in part on the determined position of the object. In certain embodiments, the method further includes generating an image that includes the subject but does not include the marker. In certain embodiments, the object floats within the bore. In certain embodiments, the object is a surface coil.

Accordingly, by utilizing ZTE scanning sequences to identify markers 88 within the bore 78 of an MRI scanner 40, some embodiments of the present invention provide for such markers 88 to be utilized as landmarks having a low risk of generating a false-positive diagnosis.

Moreover, by utilizing ZTE scanning sequences in combination with traditional MR scanning sequences in a PET-MRI system, some embodiments provide for a method of correcting acquired PET emissions for attenuation caused by a floating object/surface coil 58 within the bore 78 of an MRI scanner 40 wherein the markers 88 are not detected by traditional MR sequence scans. Thus, as is to be appreciated, some embodiments of the present invention provide for markers 88 that can be both optimally placed while remaining invisible in an image generated via an MRI scanner 40 and corresponding MRI controller 30.

Additionally, and as is to be further appreciated, in situations where a ZTE scan sequence is being used clinically, i.e., the examining physician uses an image depicting the k-space acquired in a radial manner, e.g., in radial coordinates, during the ZTE scan, the risk of a false-positive diagnosis from phase wrap artifacts is reduced as such artifacts typically appears in traditional MR scanning sequences that acquire k-space in a Cartesian manner, e.g., in Cartesian coordinates.

Further, as the markers 88 may be made from easily acquired and/or readily available materials, some embodiments of the present invention provide for convenient landmarks and/or methods of attenuation correction in PET-MRI.

As will be further understood, while the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose several embodiments of the invention, including the best mode, and also to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described invention, without departing from the spirit and scope of the invention herein involved, it is intended that all of the subject matter of the above description shown in the accompanying drawings shall be interpreted merely as examples illustrating the inventive concept herein and shall not be construed as limiting the invention.

What is claimed is:

1. A magnetic resonance imaging system comprising:
   a magnet assembly defining a bore within which an object is disposed;
   a controller in communication with the magnet assembly;
   a marker disposed on the object; and
   wherein the marker emits a rapidly decaying magnetic resonance signal after being excited by a short-TE sequence scan executed by the controller via the magnet assembly.

2. The magnetic resonance imaging system of claim 1, wherein the controller generates an image that includes the marker.

3. The magnetic resonance imaging system of claim 1, wherein the controller determines a position of the object by detecting the rapidly decaying magnetic resonance signal via the magnet assembly.

4. The magnetic resonance imaging system of claim 3 further comprising:
   a positron emission tomography sub-system that acquires PET emissions from a subject within the bore, and the controller corrects the acquired PET emissions for attenuation based at least in part on the determined position of the object.

5. The magnetic resonance imaging system of claim 1, wherein the controller generates an image that includes a subject within the bore but does not include the marker.

6. The magnetic resonance imaging system of claim 1, wherein the object floats within the bore.

7. The magnetic resonance imaging system of claim 1, wherein the object is a surface coil.

8. The magnetic resonance imaging system of claim 1, wherein the marker is in the form of adhesive tape.

9. The magnetic resonance imaging system of claim 1, wherein the marker is integrated into the object.

10. A marker for a magnetic resonance imaging system, the marker comprising:
    a body configured to be disposed on an object within a bore defined by a magnet assembly of the magnetic resonance imaging system; and
    wherein the body emits a rapidly decaying magnetic resonance signal after being excited by a short-TE sequence scan executed by the magnetic resonance imaging system.

11. The marker of claim 10, wherein the object is configured to be inserted into a subject to be imaged by the magnetic resonance imaging system.

12. The marker of claim 10, wherein the body is in the form of adhesive tape.

13. The marker of claim 10, wherein the body is integrated into the object.

14. A method for marking an object during a magnetic resonance imaging scan, the method comprising:
    placing a subject within a bore defined by a magnet assembly of a magnetic resonance imaging system, the magnet assembly in communication with a controller of the magnetic resonance imaging system;
    placing the object within the bore;
    marking the object with a marker;
    executing a short-TE sequence scan of the subject and the object via the controller and the magnet assembly;
    sensing a rapidly decaying magnetic resonance signal emitted by the marker after being excited by the short-TE sequence scan so as to detect the marker; and
    generating an image that includes the marker.

15. The method of claim 14 further comprising:
    determining a position of the object based at least in part on the detected rapidly decaying magnetic resonance signal.

16. The method of claim 15, wherein the magnetic resonance imaging system includes a positron emission tomography sub-system, and the method further comprises:
    acquiring PET emissions from the subject; and
    correcting the acquired PET emissions for attenuation based at least in part on the determined position of the object.

17. The method of claim 14 further comprising:
    generating an image that includes the subject but does not include the marker.

18. The method of claim 14, wherein the object floats within the bore.

19. The method of claim 14, wherein the object is a surface coil.

* * * * *